United States Patent [19]

Fujita

[11] Patent Number: 5,805,504

[45] Date of Patent: Sep. 8, 1998

[54] SYNCHRONOUS SEMICONDUCTOR MEMORY HAVING A BURST TRANSFER MODE WITH A PLURALITY OF SUBARRAYS ACCESSIBLE IN PARALLEL VIA AN INPUT BUFFER

[75] Inventor: Mamoru Fujita, Tokyo, Japan

[73] Assignee: NEC Corporation, Tokyo, Japan

[21] Appl. No.: 758,367

[22] Filed: Nov. 29, 1996

[30] Foreign Application Priority Data

Nov. 29, 1995 [JP] Japan .................................. 7-311238

[51] Int. Cl.[6] ............................... G11C 7/00; G11C 8/00
[52] U.S. Cl. ............................... 365/189.05; 365/189.12; 365/230.04; 711/105
[58] Field of Search ..................... 365/189.12, 189.04, 365/189.05, 230.03, 230.04; 71/168, 105

[56] References Cited

U.S. PATENT DOCUMENTS

| | | | |
|---|---|---|---|
| 4,796,231 | 1/1989 | Pinkham | 365/189.05 |
| 5,371,714 | 12/1994 | Matsuda | 365/230.03 |
| 5,381,367 | 1/1995 | Kajimoto | 365/189.01 |
| 5,384,745 | 1/1995 | Konishi | 365/230.03 |
| 5,617,555 | 4/1997 | Patel | 711/105 |

OTHER PUBLICATIONS

H. Yoo et al., "FA 14.4: A 150MHz 8–Banks 256M Synchronous DRAM with Wave Pipelining Methods", IEEE, 1995, Session 14, pp. 250–251.

*Primary Examiner*—Tod R. Swann
*Assistant Examiner*—Christopher S. Chow
*Attorney, Agent, or Firm*—Young & Thompson

[57] ABSTRACT

A synchronous semiconductor memory with a burst transfer mode is comprised of a plurality of memory cell subarrays. A plurality of internal data buses operates with an input buffer circuit to transfer data in parallel to the subarrays. The input buffer includes a shift register composed of a first and second cascade connected registers. A register output selector distributes the data signals in parallel to the plurality of internal buses.

4 Claims, 8 Drawing Sheets

SYNCHRONOUS SEMICONDUCTOR MEMORY HAVING A BURST TRANSFER MODE WITH A PLURALITY OF SUBARRAYS ACCESSIBLE IN PARALLEL VIA AN INPUT BUFFER

BACKGROUND OF THE INVENTION

1. Field of the Invention

The present invention relates to a semiconductor memory, and more specifically to a semiconductor memory having a burst mode transfer function.

2. Description of Related Art

Recently, an operation speed difference between a CPU (central processing unit) and a DRAM (dynamic random access memory) used as a main memory has become a problem, since the degree of improvement in an access speed of the DRAM is lower than a rapidly improved operation speed of the CPU, and therefore, since the DRAM cannot sufficiently satisfy the request of the CPU. Therefore, in a computer system using a high speed CPU, a cache memory having a memory capacity smaller than that of the main memory but the access speed greatly higher than that of the main memory, is provided in a CPU chip or is externally connected to the CPU, in order to absorb the operation speed difference between the CPU and the main memory.

This cache memory has a copy of a portion of the data stored in the main memory. This copy of the data is constituted of a plurality of unitary blocks, each of which is composed of a plurality of items of data having continuous addresses, and each of which is called a "page" in a virtual memory system. The CPU ordinarily accesses to the cache memory. However, when the cache memory does not include a required data, the required data is newly copied to the cache memory from the main memory. At this time, if the cache memory does not have an empty region, the data of the cache memory which is the lowest in the degree of necessity, is copied to the main memory, so that an empty region is created in the cache memory. These operations are conducted in units of page.

Therefore, a memory apparatus constituting the main memory of the system is required to have a function of outputting and receiving a train of items of data having continuous addresses, at a high speed, to and from the cache memory. For this purpose, there is known a method for outputting and receiving the data train in synchronism with an external reference clock, only by designating a head address of the data train. This is called a "burst mode transfer", and the length of the data train which can be outputted and received by designating one address, is called a "burst length". The memories configured to be capable of executing the burst mode transfer can be typically exemplified by a synchronous DRAM.

Conventionally, a general purpose DRAM (DRAM having a fast page mode) is configured to execute, after one data processing is completed, a next data processing, and therefore, has a data input/output speed on the order of 20 ns (50 MHz) at maximum. In the synchronous DRAM, on the other hand, the time required for one data processing is fundamentally the same as that required in the general purpose DRAM, however, since an internal processing is multiplexed so that a plurality of items of data are simultaneously processed in the inside of the memory, an apparent processing time required for one item of data can be shortened, with the result that the data input/output speed on the order of 100 MHz or more can be obtained. The frequency of this data inputting/outputting, namely, the frequency of the reference clocks, is called a "burst transfer frequency".

However, focusing attention to one item of data, the internal processing time of the synchronous DRAM is fundamentally the same as that of the general purpose DRAM as mentioned above. Therefore, a plurality of reference clock periods are conventionally required from the reception of a reading command until the data outputting. Similarly, a plurality of reference clock periods are conventionally required from the reception of a reading command until data has been written into a memory cell.

Here, the number of the reference clocks from the moment the reading demand is received to the moment the data is actually outputted to an external, is called a $\overline{CAS}$ (column address strobe) latency. The synchronous DRAM conventionally has a memory circuit, called a "mode register", for setting an operation condition, and the $\overline{CAS}$ latency can be set by a mode register setting command supplied from an external. The reason for adopting this configuration that the $\overline{CAS}$ latency can be set from the external, is as follows: Because other circuits or substrate wirings cannot operate with the reference clock of the maximum burst transfer frequency of the synchronous DRAM, when there is used a clock having a frequency lower than the maximum burst transfer frequency of the synchronous DRAM (namely, the frequency of the reference clock), a time required until the outputting of a first data can be shortened by setting the $\overline{CAS}$ latency at a low value within a range in which a relation between the reference clock period and the $\overline{CAS}$ latency satisfies an address access time. Accordingly, if the reference clock frequency is low, it is not necessary to set the $\overline{CAS}$ latency at a large value. To the contrary, in order to elevate the maximum burst transfer frequency under the condition that the address access time is constant, it is necessary to set the $\overline{CAS}$ latency at a large value.

On the other hand, at the time of writing, the $\overline{CAS}$ latency has no concern to the operation, if the operation is viewed from the outside of the chip. The reason for this is that: At the moment the writing command is inputted, it has become definite that the data writing is executed, and therefore, the remain is only that the processing is executed internally. Accordingly, the matter of until when the data writing processing must be completed, is limited by only when a next reading operation is started.

From another viewpoint, however, if the $\overline{CAS}$ latency becomes large, and if the reference clock frequency also becomes high, this means that the number of the reference clock cycles required for the internal writing processing increases.

Here, the prior art method for multiplexing the internal processing includes a pipelined architecture and a prefetching architecture.

Figure 1:
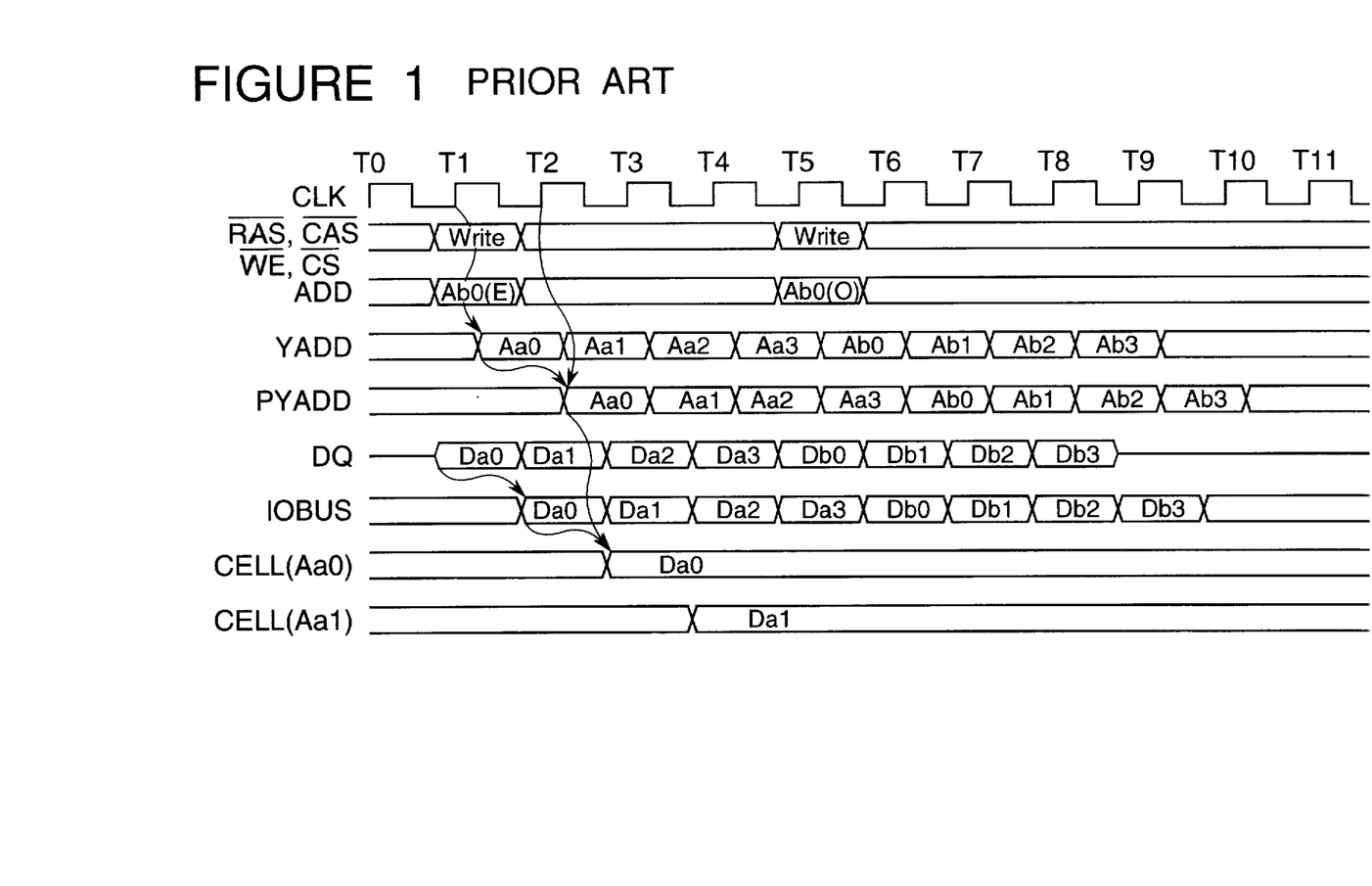
FIG. 1 is a timing chart illustrating an example of a writing operation in the prior art semiconductor memory having the pipelined architecture.

Referring to FIG. 1, there is shown a timing chart illustrating an example of a writing operation in the prior art semiconductor memory having the pipelined architecture, in the case that the number of stages is three and the writing operation having the burst length of 4 is continuously conducted two times.

In the pipelined architecture, a series of internal processing are divided into some number of stages, one item of data is sequentially processed by the respective stages in the order of the stages, and on the other hand, the respective stages operate simultaneously in parallel to one another. The shown prior art example includes a first stage for generating an internal column address YADD, a second stage for pre-decoding the internal column address YADD to generate a pre-decoded signal PYADD, and a third stage for writing data into memory cells at a column address designated by the pre-decoded signal PYADD, through an internal data bus IOBUS.

In synchronism with a rising edge of the reference clock (CLK) T1, a column address "Aa0" for a first data is generated in cycles T1~T2 by the first stage. Then, in synchronism with a rising edge of the reference clock (CLK) T2, an internal pre-decoded column address signal PYADD is generated in cycles T2~T3 by the second stage, and at the same time, in synchronism with the rising edge of the reference clock (CLK) T2, a column address "Aa1" for a second data is generated by the first stage. Since all the stages are caused to operate in parallel to one another, the data corresponding to the number of the stages are processed in parallel. Since all the stags are controlled by the reference clock CLK, there is no possibility that a plurality of items of data concurrently exist in one stage. As a result, a series of items of data can be written in respective designated memory cells in synchronism with the clock CLK without an internal collision of data.

Incidentally, in FIG. 1, "ADD" is an external address bus and "DQ" is an external data bus. "IOBUS" is an internal data bus. "Aa0(E)" is an address given to the external address bus "ADD" in a first burst, and "Ab0(O)" is an address given to the external address bus "ADD" in a second burst. "Aa0", "Aa1", "Aa2" and "Aa3" are four continuous column addresses generated for the first burst, and "Ab0", "Ab1", "Ab2" and "Ab3" are four continuous column addresses generated for the second burst. "Da0", "Da1", "Da2" and "Da3" are four continuous data to be written in the first burst, and "Db0", "Db1", "Db2" and "Db3" are four continuous data to be written in the second burst. "CELL (Aa0)" is a memory cell (or one word of memory cells) which is located at the column address "Aa0" and is to be written with the data "Da0", and "CELL(Aa1)" is a memory cell (or one word of memory cells) which is located at the column address "Aa1" and is to be written with the data "Da1".

Figure 2:
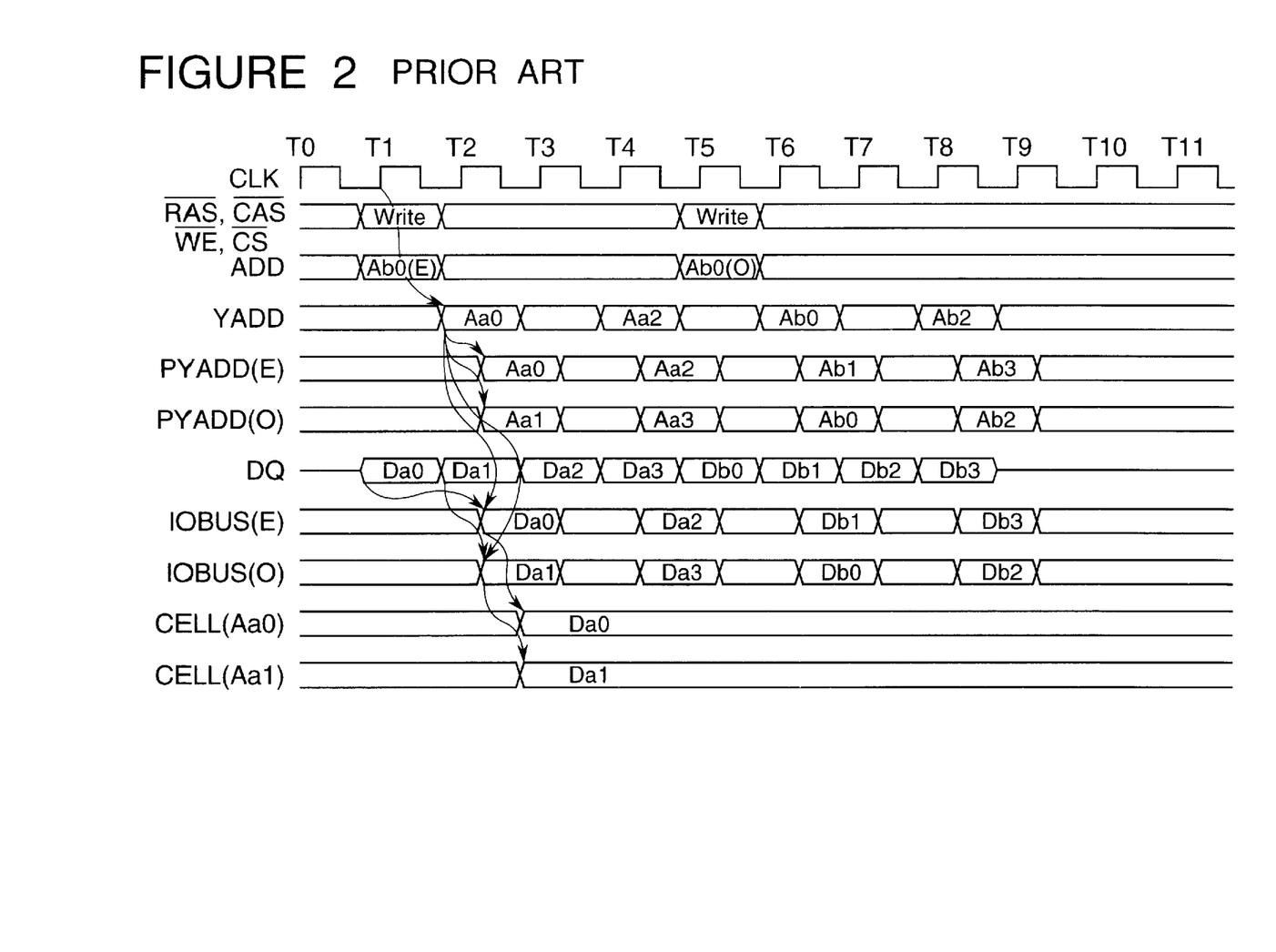
FIG. 2 is a timing chart illustrating an example of a writing operation in the prior art semiconductor memory having the prefetching architecture.

Referring to FIG. 2, there is shown a timing chart illustrating an example of a writing operation in the prior art semiconductor memory having the prefetching architecture, in the case that the number of parallelism (namely, the number of prefetches) is two and the writing, operation having the burst length of 4 is continuously conducted two times. In FIG. 2, data and addresses corresponding to those shown in FIG. 1 are given the same Reference Signs, and explanation thereof will be omitted.

In the prefetching architecture, an internal data processing path is divided into a plurality of paths, so that the same processing are substantially simultaneously carried out for a plurality of items of data. However, since the plurality of items of data externally supplied cannot be obtained simultaneously, when serially supplied data items are internally latched by the number of parallel paths, the latched data items are serial-to-parallel converted. Thereafter, a plurality of writing processings are conducted in parallel. Here, in order to latch the serially supplied data items by the number of parallel paths before the serial-to-parallel conversion, the reference clocks of the same number as the number of parallel paths are required. Accordingly, if the processing to be conducted after the serial-to-parallel conversion can be completed with the reference clocks of the same number as the number of parallel paths, all of the serial data supplied without intermission can be written to memory cells.

In the example shown in FIG. 2, an address "Abo(E)" of an external address bus ADD and data "Da0" of an external data bus DQ are latched at a rising edge of the reference clock (CLK) T1, and data "Da1" is latched at a rising edge of the reference clock (CLK) T2. The latched data "Da0" and "Da1" are supplied to two parallel internal data buses IOBUS(E) and IOBUS(O), respectively. On the other hand, an internal column address "Aa0" is generated on the basis of the latched address "Ab0(E)", and a pair of pre-decoded column address signals "Aa0" and "Aa1" are supplied to a pair of pre-decoded column address buses PYADD(E) and PYADD(O), respectively. Thus, writing processings for "Da0" and "Da1" are conducted in parallel. Thus, data "Da0" and "Da1" are written into memory cells CELL(Aa0) and CELL(Aa1), respectively, in parallel, by two reference clock cycles from T1 before T3.

Figure 3:
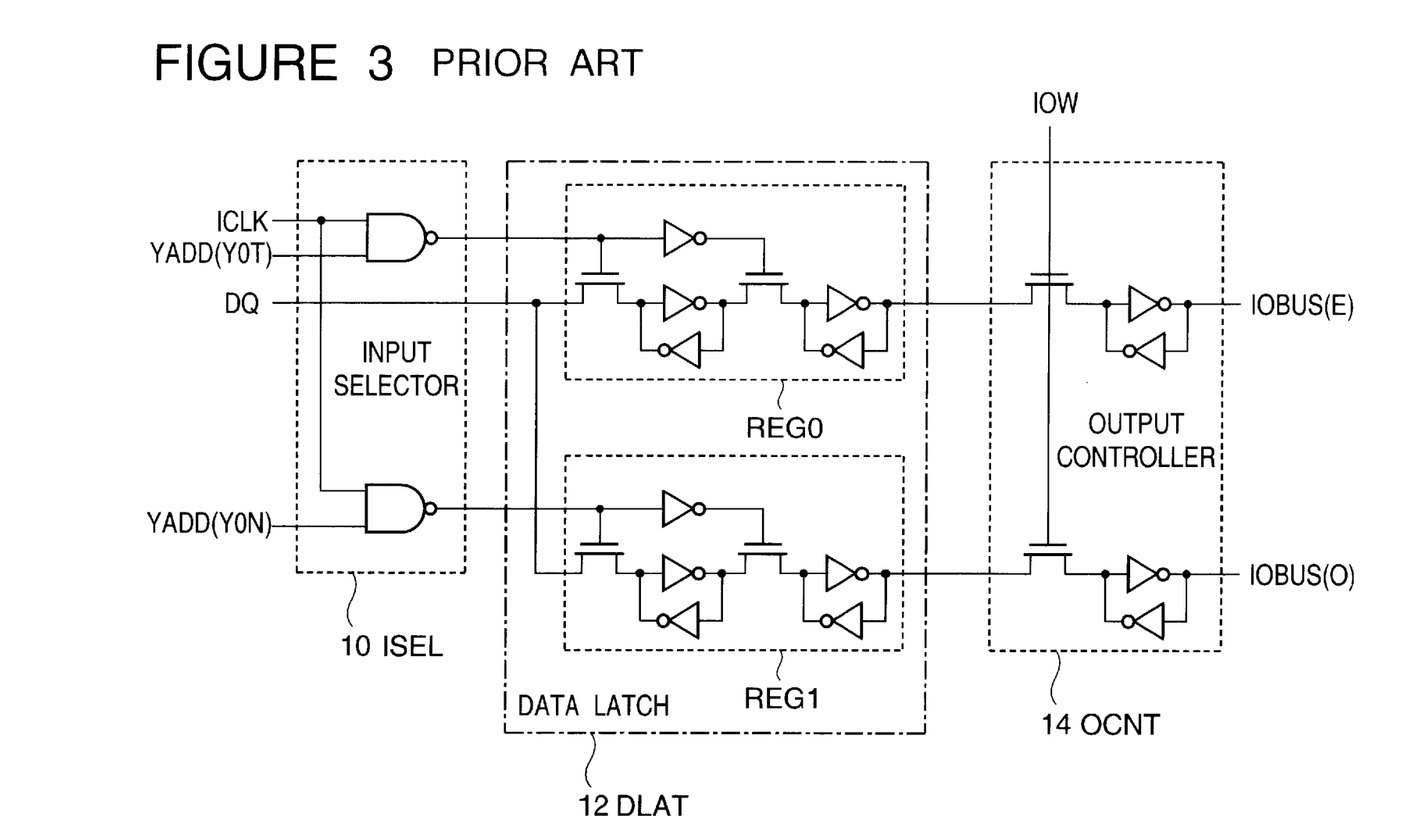
FIG. 3 is a circuit diagram of an example of a data-in buffer which is incorporated in the prior art semiconductor memory and which has a serial-to-parallel conversion function for a two-bit prefetching.

Referring to FIG. 3, there is shown a circuit diagram of an example of a data-in buffer which is incorporated in the prior art semiconductor memory and which has a serial-to-parallel conversion function for a two-bit prefetching.

The shown data-in buffer includes an input selector (ISEL) 10, a data latch (DLAT) 12 and an output controller (OCNT) 14. On the basis of a pair of complementary bits YADD(Y0T) and YADD(Y0N) of the least significant bit signal of the internal column address signal and in synchronism with an reference clock ICLK, the input selector 10 alternatively distributes an external data DQ to a latch REG0 for an even address and a latch REG1 for an odd address, which constitute the data latch 12.

In the two-bit prefetching architecture, since data of an even address and data of an odd address are supplied from an external, every two cycles of the reference clock ICLK from a heading of the burst, the two latches REG0 and REG1 of the data latch 12 are updated every two cycles of the reference clock ICLK. When two new bits of data become complete in the data latch 12, a data-in buffer output control signal IOW is activated, so that the shown data-in buffer outputs the two new bits of data from the output controller 14.

Thus, the external data is serial-to-parallel converted by the shown data-in buffer, so that two bits of data are outputted simultaneously and in parallel to a data bus IOBUS(E) for an even address and a data bus IOBUS(O) for an odd address, respectively, every two cycles of the reference clock ICLK As mentioned above, the method for realizing a high maximum burst transfer frequency in the semiconductor memory such as the synchronous DRAM having the burst mode transfer function includes the pipelined architecture and the prefetching architecture.

In order to elevate the maximum burst transfer frequency in the pipelined architecture, it is necessary to increase the number of stages so that the time of the processing performed in each stage is shortened and the degree of parallelism is increased. However, because of the nature of the processing internally conducted in the DRAM, the positions capable of partitioning the stages are limited. In addition, a minimum reference clock period must be fitted to a stage which needs a maximum processing time. Furthermore, a circuit for interconnecting each pair of adjacent stages in a processing stream is required, and therefore, an overhead is inevitably increased. As a result, the number of stages is actually limited to three or four. In other words, the degree of data multiplexing is also limited to three or four.

On the other hand, in order to elevate the maximum burst transfer frequency in the prefetching architecture, it is necessary to increase the number of items of data to be processed in parallel to each other. For this purpose, it is necessary to provide the same circuits of the number corresponding to the number of parallel paths, with the result that the circuit scale inevitably becomes large and therefore a necessary chip size correspondingly increases. Furthermore, in this prefetching architecture, the inputting/outputting of data must be conducted in units of the number of items of data to be processed in parallel, and therefore, cannot be conducted in units of the number smaller than the number of items of data processed in parallel. Accordingly, if the degree of parallelism is elevated, the degree of freedom in function drops to the contrary so that a computer system adopting this architecture lowers its performance. Because of the above reasons, the degree of parallelism, namely, the degree of data multiplexing is limited to two in the prefetching architecture.

As mentioned above, both of the pipelined architecture and the prefetching architecture can realize the speed-up of the operation by elevating the degree of data multiplexing, however, the degree of data multiplexing is actually limited for various reasons. In other words, the maximum burst transfer frequency is limited.

Incidentally, in order to conduct the writing in the prefetching architecture, the column address must be internally processed to distribute data to internal data buses corresponding to respective column addresses. On the other hand, an item of data firstly supplied from external, of a plurality of items of data to be written in parallel, and a column address where the plurality of items of data are to be written, are simultaneously supplied from the external. Therefore, in order to distribute data to internal data buses in parallel, it is necessary to wait the completion of the internal column address processing. This lowers the speed of the writing operation.

SUMMARY OF THE INVENTION

Accordingly, it is an object of the present invention to provide a semiconductor memory having a burst mode transfer function, which has overcome the above mentioned defects of the conventional ones.

Another object of the present invention is to provide a semiconductor memory having a burst mode transfer function, capable of conducting the writing operation at an elevated speed.

The above and other objects of the present invention are achieved in accordance with the present invention by a semiconductor memory having a burst mode transfer function, comprising:

a plurality of memory cell sub-arrays which are accessible in parallel and simultaneously;

a plurality of internal data buses for inputting and outputting data to and from the plurality of memory cell sub-arrays, in parallel; and an input buffer circuit receiving an external data signals continuously and sequentially in time in synchronism with a reference clock signal, for converting the receiving serial data into a parallel data under control of an external command signal and an external address signal, so as to distribute the parallel data to the plurality of internal data buses, the input buffer circuit including a shift register circuit composed of a plurality of cascade-connected registers and for latching and shifting the external data signals only in response to the reference clock signal, the cascade-connected registers outputting, in parallel, the data latched in the respective registers, and a register output selecting means receiving the data signals outputted in parallel from the cascade-connected registers, for distributing the received parallel data signals, in parallel, to the plurality of internal data buses in accordance with the external address signal.

In one embodiment of the semiconductor memory in accordance with the present invention, the input buffer circuit further includes a buffer output control means for transferring the outputs of the register output selecting means, simultaneously and in parallel, to the plurality of internal data buses, in synchronism with an edge of the reference clock signal by which the external data signal finally supplied to the shift register circuit is latched in the shift register circuit.

A preferred embodiment of the semiconductor memory in accordance with the present invention further includes a function selecting means for designating the function of the input buffer circuit, so that the input buffer circuit is controlled by an output of the function selecting means to alternatively assume a first mode of distributing the parallel data signals outputted from the shift register circuit, in parallel, to the plurality of internal data buses in accordance with the external address signal, or a second mode of outputting only the external data signal finally supplied and latched in the shift register circuit, to one of the plurality of internal data buses in accordance with the external address signal.

Preferably, the output of the function selecting means is set in interlocking with the setting of the number of reference clock cycles required from an input of the external command instructing a reading to an output of read-out data.

The above and other objects, features and advantages of the present invention will be apparent from the following description of preferred embodiments of the invention with reference to the accompanying drawings.

DESCRIPTION OF THE PREFERRED EMBODIMENTS

Figure 4:
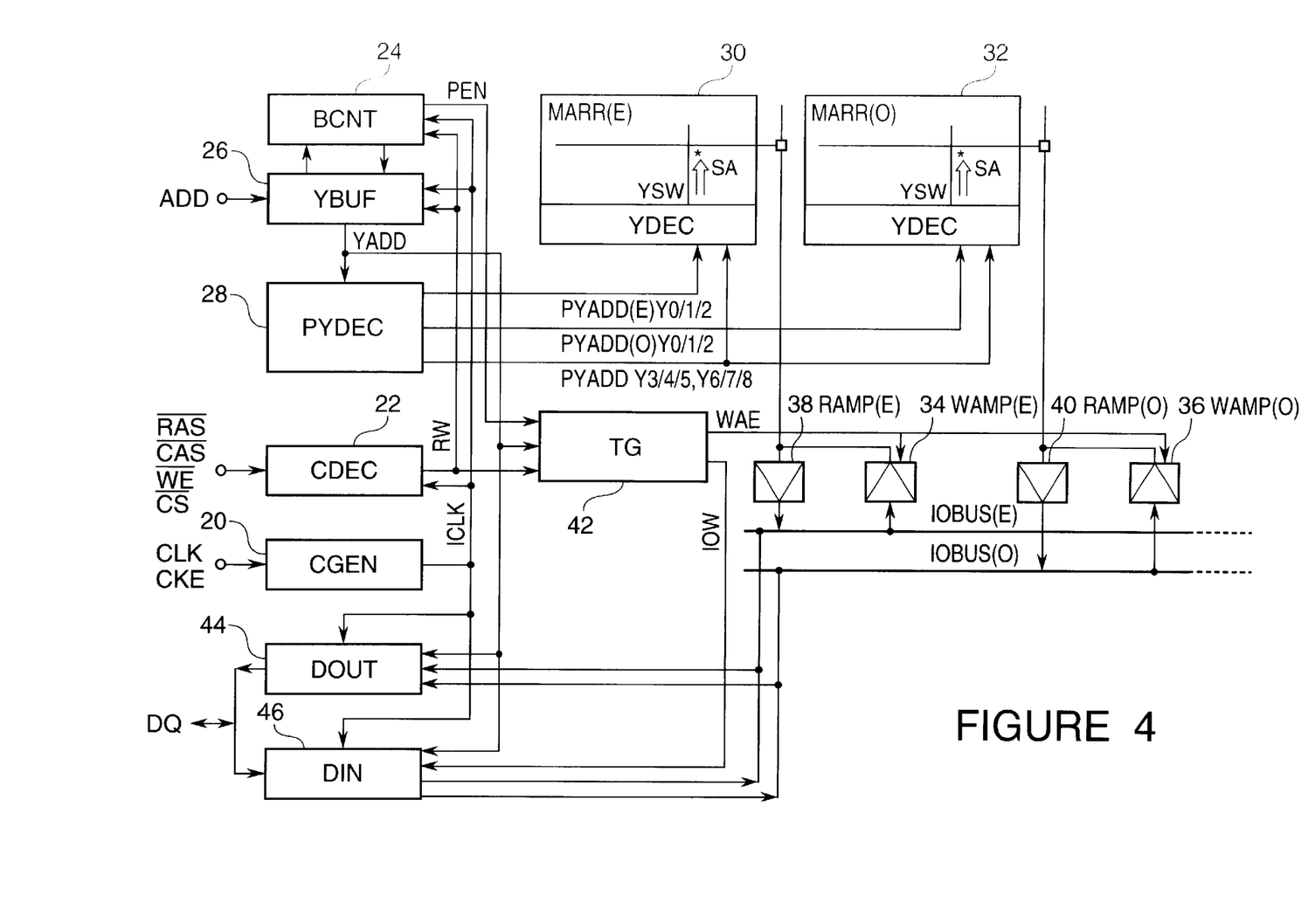
FIG. 4 is a block diagram of a first embodiment of the semiconductor memory in accordance with the present invention, having the burst mode transfer function.

Referring to FIG. 4, there is shown a block diagram of a first embodiment of the semiconductor memory in accordance with the present invention, having the burst mode transfer function.

In the following, the shown embodiment will be described under the assumption that the column address is composed of Y0 to Y8, a maximum burst length is 8, and the number of prefetches is 2. However, it is to be noted that the present invention is in no way limited to these numeral examples, and can be embodied with any different numeral values. In addition, the number of banks and the number of data bits (DQ) will not be specified, since these matters give no influence to the present invention. Conventionally, the number of data bits is for example 8, 16, 32, or 64, however, the following embodiments will be described under the assumption that the number of data bits is one for simplification of description and drawings.

In the embodiment shown in FIG. 4, an internal clock generating circuit (CGEN) 20 receives a reference clock CLK and a clock enable signal CKE both supplied from an external, for generating an internal reference clock ICLK. If the clock enable signal CKE is at low level at a rising edge of the external clock CLK, the internal reference clock ICLK corresponding to the clock CLK of a next cycle is not generated.

A command decoder (CDEC) 22 fetches various external command signals such as a row address strobe signal $\overline{RAS}$, a column address strobe signal $\overline{CAS}$, a write enable signal $\overline{WE}$ and a chip select signal $\overline{CS}$, in response to a leading or rising edge of the internal reference clock ICLK, and decodes the command designated by a combination of the various external command signals, to generate various internal control signals. In the synchronous DRAM, the commands includes several different commands such as an activation command, however, for simplification of drawing and description, only an internal read/write signal RW corresponding to a read/write command and relating to the present invention is shown.

A burst counter (BCNT) 24 receives the read/write signal RW which is generated when the reading command or the writing command is given form the external, and generates a burst period signal PEN. Specifically, an internal counter (not shown) of the burst counter 24 is initialized by the read/write signal RW and starts to count the internal clock ICLK supplied after the internal counter is initialized, so that the burst counter 24 continues to output the burst period signal PEN during a burst period (a total period of the internal clocks ICLK of the number corresponding to the burst length).

An internal column address generating circuit (YBUF) 26 fetches an external address signal ADD in synchronism with the internal clock ICLK after the internal read/write mode signal RW, namely, when the reading command or the writing command is given, and then, outputs an internal column address signal YADD having the same value as that of the external address signal ADD. Thereafter, during the burst period, the internal column address generating circuit 26 generates an updated internal column address signal YADD every two cycles of the internal clock ICLK. In addition, the internal column address generating circuit 26 is coupled to the burst counter 24.

Figure 6:
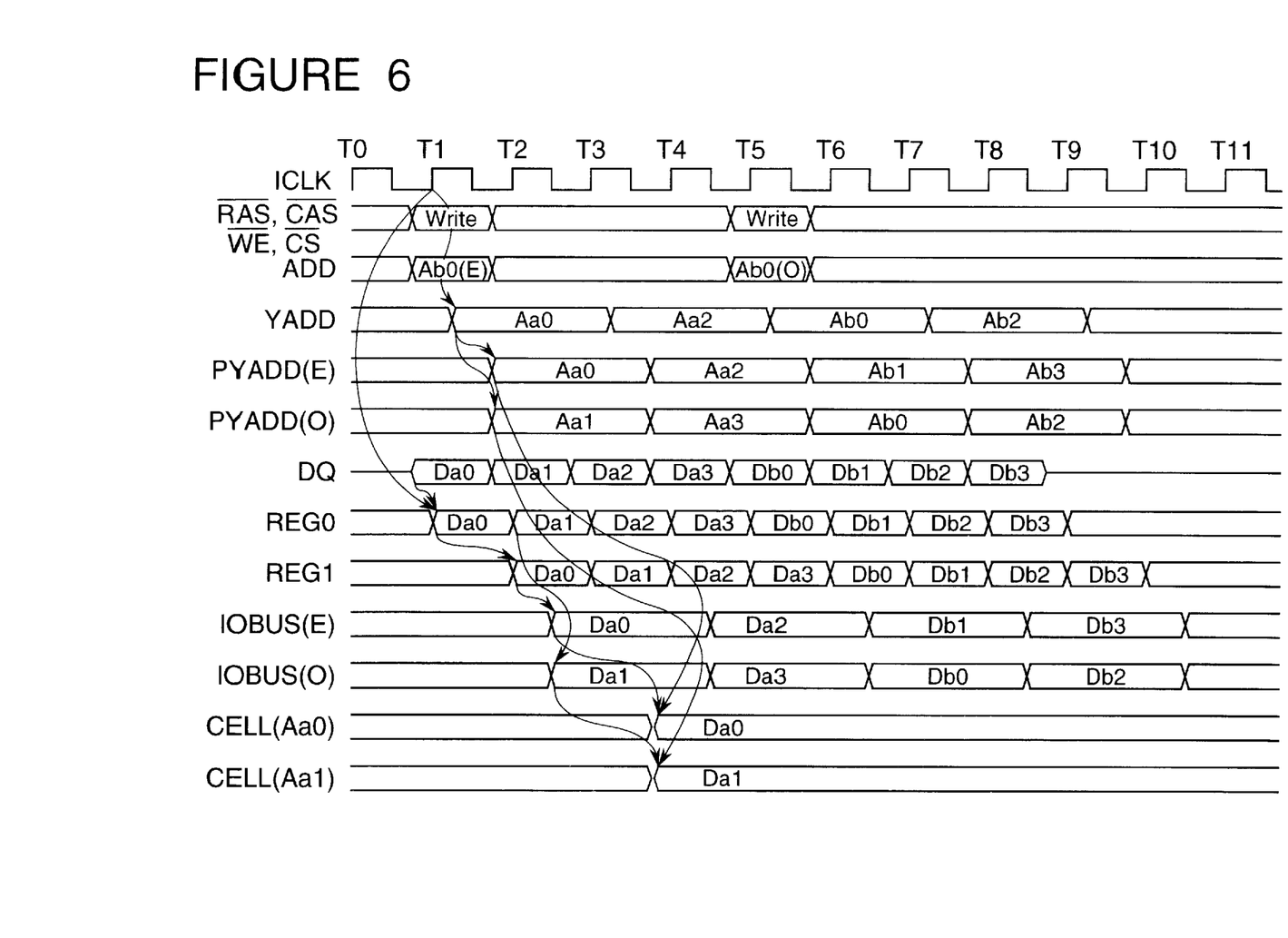
FIG. 6 is a timing chart illustrating an operation of the first embodiment of the semiconductor memory in accordance with the present invention.

Here, assuming that, as shown in FIG. 6 which is a timing chart illustrating an operation of the first embodiment of the semiconductor memory in accordance with the present invention, a leading edge of the internal clock ICLK in response to which the write command is fetched, is a first one, "Aa0", "Aa2", . . . of column addresses for the data supplied in the burst mode, namely, the internal column addresses YADD corresponding to the edge of odd-numbered clocks ICLK are generated, but "Aa1", "Aa3", . . . , namely, the internal column addresses YADD corresponding to the edge of even-numbered clocks ICLK are not generated. Namely, the value of the internal column address YADD corresponding to the edge of the just-preceding odd-numbered clock ICLK is held. Accordingly, the operation of the generation of the internal column address YADD and the succeeding operations are conducted in units of two cycles of the internal clock ICLK.

A column address pre-decoder (PYDEC) 28 receives and pre-decodes the internal column address signal YADD, and generates a few sets of pre-decoded column addresses PYADD. In the shown embodiment, the column address pre-decoder 28 simultaneously generates a column address "Aa0", "Aa2", . . . , for odd-numbered items of data in the burst designated by YADD, and a column address "Aa1", "Aa3", . . . , for even-numbered items of data in the same burst and outputted next to the above odd-numbered item of data. A combination of pre-decoded column addresses is dependent upon the burst length and the burst mode, but the column addresses for a series of items of data outputted in the burst mode in the synchronous DRAM necessarily alternately become an odd number and an even number. Therefore, one of the pre-decoded column addresses is an odd number, and the other is an even number.

In the case of the 8-bit burst, accordingly, three LSB bits Y0/1/2 of the column address signal required for realizing the 8-bit burst are pre-decoded, and on the basis of the pre-decoding, two of $2^3(=8)$ PYADD signal lines are simultaneously selected. Specifically, one of four even-numbered column address lines (Y0=0, PYADD(E)) of the 8 PYADD signal lines, and one of four odd-numbered column address lines (Y0=1, PYADD(O)) of the 8 PYADD signal lines, are simultaneously selected. On the other hand, since the address bits other than three LSB bits Y0/Y1/Y2 are the same in the even-numbered position and in the odd-numbered position in each burst, the PYADD column address lines (PYADD Y3/4/5, Y6/7/8) may be in common.

A memory cell array (MARR), which constitutes a core of the DRAM, is divided into an even-numbered column address memory cell sub-array (MARR(E)) 30 and an odd-numbered column address memory cell sub-array (MARR(O)) 32, on the basis of data bits (DQ) and banks. Therefore, the even-numbered column address memory cell sub-array 30 is constituted of memory cells all having an even-numbered column address (Y0=0), and the odd-numbered column address memory cell sub-array 32 is constituted of memory cells all having an odd-numbered column address (Y0=1). By the even-numbered and odd-numbered pre-decoded column addresses PYADD simultaneously generated by the column address pre-decoder 28, a column selection line YSW in each of the sub-arrays 30 and 32 is simultaneously activated.

Data is simultaneously written to sense amplifiers SA connected to the activated column selection lines YSW, from an even-numbered column address internal data bus IOBUS (E) and an odd-numbered column address internal data bus IOBUS(O) through write amplifiers (WAMP(E)) 34 and (WAMP(O)) 36, respectively. Accordingly, viewing the whole of the core of the DRAM, two items of data sequentially appearing on an external data bus DQ are written simultaneously and in parallel in each one writing operation. Thus, if the above mentioned operation is conducted within two cycles of the internal clock ICLK, the external data supplied without intermission can be written to the memory cells.

As will be apparent to persons skilled in the art, when data is read, data is supplied from the sense amplifiers SA connected to the activated column selection lines YSW, through read amplifiers (RAMP(E)) 38 and (RAMP(O)) 40 to the even-numbered column address internal data bus IOBUS(E) and the odd-numbered column address internal data bus IOBUS(O), respectively.

A timing signal generator (TG) generates a data-in buffer output signal IOW and a write amplifier enable signal WAE on the basis of the internal clock ICLK and with reference to the signals PEN and YADD.

The even-numbered column address internal data bus IOBUS(E) and the odd-numbered column address internal data bus IOBUS(O) are coupled to each of a data-out buffer (DOUT) 44 and a data-in buffer (DIN) 46, each of which is connected to receive the internal clock ICLK and the internal column address YADD, and also connected to the external data bus DQ.

In the writing operation, the data-in buffer 46 receives an external serial data appearing on the external data bus DQ, and has a serial-to-parallel conversion function of latching the external serial data appearing on the external data bus DQ, bit by bit, in synchronism with a rising edge of each internal clock ICLK, and simultaneously outputting a plurality of latched data bits to a plurality of internal data buses.

Figure 5:
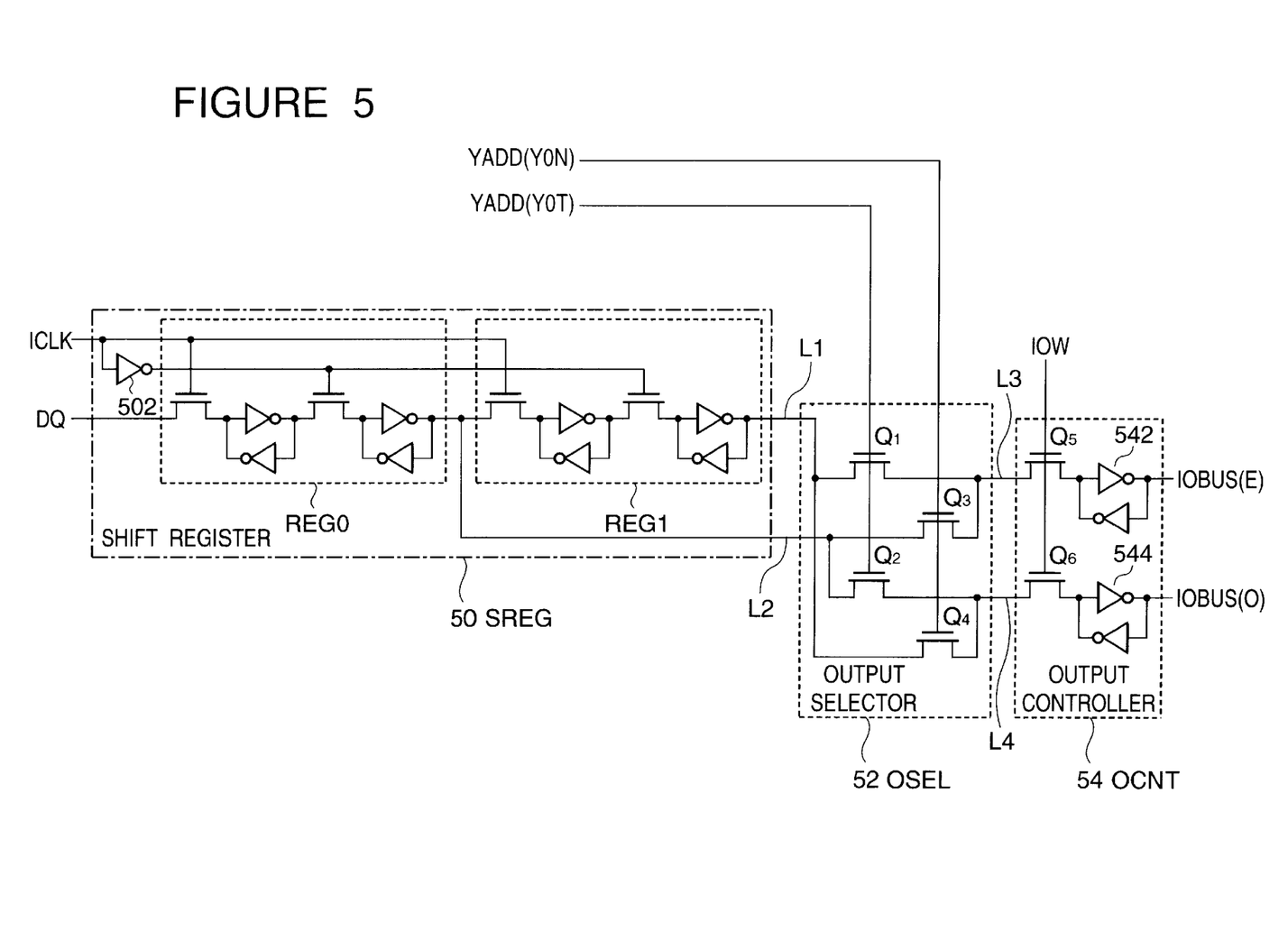
FIG. 5 is a circuit diagram of the data-in buffer incorporated in the semiconductor memory shown in FIG. 4.

Referring to FIG. 5, there is shown a circuit diagram of the data-in buffer 46 incorporated in the semiconductor memory shown in FIG. 4.

As shown in FIG. 5, the data-in buffer 46 includes a shift register (SREG) 50 receiving the external data DQ in synchronism with the internal clock ICLK and having two parallel output lines L1 and L2, a register output selector (OSEL) 52 receiving the two parallel output lines L1 and L2, and having two parallel output lines L3 and L4, and a buffer output controller (OCNT) 54 receiving the two parallel output lines L3 and having a pair of output connected to the internal data buses IOBUS(E) and IOBUS(O), respectively.

The shift register 50 includes a pair of cascade-connected registers REG0 and REG1 which are controlled by the internal clock ICLK and an inverted clock obtained from an output of an inverter 502 receiving the internal clock ICLK. The first register REG0 has an input receiving the external data DQ and an output connected to an input of the second register REG1 and the output line L2. The second register REG1 has an output connected to the output line L1. With this arrangement, the shift register 50 latches the external data DQ in synchronism with the internal clock ICLK, and the data latched in the shift register 50 is shifted in synchronism with the internal clock ICLK. Accordingly, the first register REG0 holds a last input data, and the second register RFG1 holds the data inputted before the last input data by one cycle.

The register output selector 52 includes a first transfer gate transistor Q1 connected between the line L1 and the line L3, a second transfer gate transistor Q2 connected between the line L2 and the line L4, a third transfer gate transistor Q3 connected between the line L2 and the line L3, and a fourth transfer gate transistor Q4 connected between the line L1 and the line L4. The transfer gate transistors Q1 and Q2 are controlled by the least significant bit YADD(Y0T) of the internal column address signal YADD, and the transfer gate transistors Q3 and Q4 are controlled by an inverted signal YADD(Y0N) of the least significant bit YADD(Y0T) of the internal column address signal YADD. Thus, one of the lines L1 and L2 is distributed toward the even-numbered column address internal data bus IOBUS(E), and the other is distributed toward the odd-numbered column address internal data bus IOBUS(O).

For example, when the internal column address signal YADD indicates an even number, namely, when the inverted least significant bit signal YADD(Y0N) is active and the non-inverted least significant bit YADD(Y0T) is inactive, the data held in the first register REG0 is distributed to the even-numbered column address internal data bus IOBUS (E), and the data held in the second register REG1 is distributed to the odd-numbered column address internal data bus IOBUS(O). On the other hand, if the internal column address signal YADD indicates an odd number, the data held in the first register REG0 is distributed to the odd-numbered column address internal data bus IOBUS(O), and the data held in the second register REG1 is distributed to the even-numbered column address internal data bus IOBUS(E).

The output controller 54 includes a transfer gate transistor Q5 having one end connected to the line L3, another transfer gate transistor Q6 having one end connected to the line L4, a latch 542 having an input connected to the other end of the transfer gate transistor Q5 and an output connected to the internal data bus IOBUS(E), and another latch 544 having an input connected to the other end of the transfer gate transistor Q6 and an output connected to the internal data bus IOBUS(O). The transfer gate transistors Q5 and Q6 are controlled in common by the data-in buffer output control signal IOW. Thus, under control of the data-in buffer output control signal IOW, the output controller 54 outputs the parallel two bits of data distributed and outputted from the register output selector 52, to the internal data bus IOBUS (E) and IOBUS(O), simultaneously and in parallel, respectively.

Now, an operation of the first embodiment of the semiconductor memory in accordance with the present invention will be describe with reference to FIG. 6. Here, signals supplied from an external are the same in a conventional synchronous DRAM known to persons skilled in the art.

If the external clock signal CLK and an active clock enable signal CKE are supplied from the external, the internal clock generating circuit 20 generates the internal clock ICLK. Although not shown in FIG. 6, even if the external clock signal CLK is supplied, if the clock enable signal CKE is not active, the internal clock ICLK is not generated. Therefore, although the external clock CLK is supplied with a constant period, the internal clock ICLK is not necessarily generated with a constant period. The circuit other than the internal clock generating circuit 20 is driven with the internal clock ICLK, not the external clock CLK.

A group of external command signals ($\overline{RAS}$, $\overline{CAS}$, $\overline{WE}$, $\overline{CS}$) are supplied from the external. In FIG. 6, these four signals are shown together, and "Write" in FIG. 6 indicates that the write command is inputted. Specifically, the write command is designated when the row address strobe signal $\overline{RAS}$ is at a logical high level, the column address strobe signal $\overline{CAS}$ is at a logical low level, the write enable signal $\overline{WE}$, is at the logical low level and the chip select signal $\overline{CS}$ is at the logical low level. These command signals are fetched into the command decoder 22 in synchronism with a clock edge of the internal clock ICLK, and a logical level combination of these command signals is decoded. When the read command or the write command is inputted, the internal read/write signal RW is generated.

At the same time, the external address signal ADD is supplied from the external. The value "Aa0" of the external address signal ADD when the write command is inputted, indicates a column address for a heading data of the burst. When the internal read/write signal RW is generated in response to the write command, the external address signal ADD is latched in the internal column address buffer 26, so that the internal column address signal YADD is generated. At this time, the value of the internal column address signal YADD is the same as the value "Aa0" of the external address signal ADD, and therefore, indicates the column address for a heading data of the burst. Furthermore, the burst counter 24 is reset, so that it is confirmed that the cycle of the internal clock signal ICLK at this time is a heading of the burst operation, and the burst enable signal PEN continues to be maintained in an active condition during a total period of the cycles of the internal clocks ICLK of the number corresponding to the burst length.

Thereafter, during a period in which the burst enable signal PEN is in an active condition, the internal column address buffer circuit 26 outputs the internal odd-numbered column address signal YADD, "Aa2", . . . , in synchronism with the internal clock ICLK, every two cycles of the internal clock ICLK.

The internal column address signal YADD thus generated is pre-decoded by the column address pre-decoder 28, which in turn generates a few sets of pre-decoded column address signals PYADD. In the example shown in FIG. 6, the write command is inputted two times. At a first write command in the time T1, the external address ADD is an even number "Aa0", and therefore, the column address "Aa0" for the heading or first data in the same burst is outputted to the even-numbered column address bus PYADD(E), and the column address "Aa1" for the second data in the burst is outputted to the odd-numbered column address bus PYADD (O). However, at a second write command in the time T5, the external address ADD is an odd number "Ab0", and therefore, the column address "Ab0" for the heading or first data in the burst is outputted to the odd-numbered column address bus PYADD(O), and the column address "Ab1" for the second data in the same burst is outputted to the even-numbered column address bus PYADD(E).

The column address bus PYADD(E) is coupled to a column decoder YDEC of the first memory cell sub-array 30, and the column address bus PYADD(O) is coupled to a column decoder YDEC of the second memory cell sub-array 32, so that the column selection lines YSW in each of the memory cell sub-arrays is selectively activated in accordance with the respective given even-numbered and odd-numbered column addresses.

In parallel to the above mentioned processing of the column address, the following processing for the data signal is conducted.

A burst heading or first data "Da0" (even-numbered address) supplied together with the external address signal ADD is latched in the first register REG0 of the shift register 50 in the data-in buffer 46, and at the next cycle (T2), the data "Da0" is shifted to the second register REG1 in the shift register 50, and at the same time, a second data "Da1" (odd-numbered address) in the same burst is latched in the first register REG0.

As mentioned above, until this time, the internal column address YADD has been generated during a period of cycles T1 and T2. Accordingly, since it is already possible to select the internal data buses IOBUS(E) and IOBUS(O) by the output selector 52 in the data-in buffer 46, the first data "Da0" and the second data "Da1" are distributed to the even-numbered column address internal data bus IOBUS(E) and the odd-numbered column address internal data bus IOBUS(O), respectively.

As a result, the first data "Da0" and the second data "Da1" are written into memory cells at corresponding addresses, through the internal data buses IOBUS(E) and IOBUS(O), the write amplifiers WAMP(E) and WAMP(O), and the sense amplifiers SA of the memory cell sub-arrays 30 and 32, respectively.

The above mentioned control of data paths from the output of the data-in buffer to the memory cells for the internal writing processing is conducted on the basis of only the edge of the internal clock ICLK which is used for latching the data bit supplied later in sequence, of each two data bits to be written in parallel, such as the first data bit and the second data bit in the burst. Namely, since, in the data path from the output of the data-in buffer to the memory cells for the internal writing processing, there is inserted no means which must be synchronized with the internal clock ICLK, an asynchronous writing processing is carried out.

Therefore, if the frequency of the internal clock ICLK becomes high, before the writing operation for the preceding data has not yet been completed, the writing operation for the next data starts. Namely, since a plurality of items of data concurrently exist in the writing processing path downstream of the data-in buffer, a pipeline operation is conducted. Namely, an asynchronous pipelined writing processing is realized.

At this time, it is some cases that, before the processing of the preceding data has been completed at one internal processing position, the next data reaches the same internal processing position. For example, before the data outputted to the internal data bus IOBUS has become definite, the internal column address signal PYADD changes to the column address for the next data. In this case, an erroneous operation occurs, but in the prior art, this erroneous operation similarly occurs under the same operation condition. Therefore, this is not a disadvantage inherent to only the present invention. Rather, since, in the prior art, the respective stages was required to be synchronized to one another in operation, the present invention can elevate the frequency of the internal clock ICLK with no erroneous operation, by the degree corresponding to the fact that there is required no overhead for causing the operation of the respective stages to be synchronized to one another by the internal clock ICLK.

As mentioned above, since the shown embodiment of the semiconductor memory in accordance with the present invention having the burst mode transfer function is characterized in that the data writing is conducted on the basis of only the edge of the internal clock ICLK which is used for latching the data supplied later in sequence, of each two data bits to be written simultaneously in parallel to the internal data buses IOBUS, the data writing is in no way limited by other factors, for example, the column address signal supplied from the external. Accordingly, even if the address access time in the reading operation is constant, it is possible to elevate the burst transfer frequency by using a high frequency reference clock and by increasing the column address strobe $\overline{\text{CAS}}$ latency. Therefore, the writing operation can be speeded up.

However, in the case that the memory is operated with a low frequency (for example, when it is necessary to drive the system at a low frequency because of other circuit element or a substrate condition), if the column address strobe $\overline{\text{CAS}}$ latency is large, the time required until the heading data in the burst is outputted, becomes large in comparison with a possible address access time. In this situation, therefore, it is necessary to set the column address strobe $\overline{\text{CAS}}$ latency at a small value, so that the time required until the data outputting is comparable to the address access time. As mentioned hereinbefore, in the synchronous DRAM, it is possible to set the column address strobe $\overline{CAS}$ latency by use of a mode register.

To the contrary, when the column address strobe $\overline{CAS}$ latency is set at a large value and the burst transfer frequency is elevated, since the data input frequency becomes high at the writing time, it is necessary to elevate the degree of multiplexing in the internal processing of the data. In the shown embodiment, the pipelined architecture and the prefetching architecture are used in combination and simultaneously to elevate the degree of multiplexing, with the result that a high maximum burst transfer frequency can be realized.

Now, a second embodiment of the semiconductor memory in accordance with the present invention will be described.

The first embodiment adopts the prefetching architecture, and therefore, even when the column address strobe $\overline{CAS}$ latency is set to a value lower than the degree of parallelism, the inputting/outputting of data must be conducted in units corresponding to the degree of parallelism. This is inconvenient. In order to avoid this inconvenience, the second embodiment is so configured to use the pipelined architecture and the prefetching architecture in combination and simultaneously when a large $\overline{CAS}$ latency is set to realize a high burst transfer frequency, but to use only the pipelined architecture (namely, without using the prefetching architecture) when a small $\overline{CAS}$ latency is set.

Accordingly, when a large $\overline{CAS}$ latency is set, the second embodiment operates completely similarly to the first embodiment shown in FIGS. 4 and 5, and therefore, the whole construction expressed in a block diagram of the second embodiment is the same as the construction of the first embodiment as shown in FIG. 4. In the second embodiment, however, dependently upon the set $\overline{CAS}$ latency, the respective blocks shown in FIG. 4 have functions different from those of the first embodiment. First, differences in function will be described in the following:

The internal column address signal YADD is outputted every two cycles of the reference internal clock ICLK when a large $\overline{CAS}$ latency is set, but is outputted at each reference internal clock ICLK when a small $\overline{CAS}$ latency is set.

Furthermore, when a large $\overline{CAS}$ latency is set, the pre-decoded even-numbered and odd-numbered column addresses PYADD(E) and PYADD(O) are simultaneously generated from one internal column address YADD, similarly to the first embodiment. However, when a small $\overline{CAS}$ latency is set, one pre-decoded column address PYADD is generated from one internal column address YADD. At this time, whether the pre-decoded column address PYADD generated is outputted to PYADD(E) or PYADD(O), is determined by whether the internal column address YADD is an even number or an odd number.

In addition, when a large $\overline{CAS}$ latency is set, two items of data sequentially supplied from the external are supplied from the data-in buffer simultaneously to the internal data buses IOBUS(E) and IOBUS(O), every two cycles of the internal clock ICLK, similarly to the first embodiment. Here, which of the two items of data is supplied to the internal data buses IOBUS(E), is dependent upon whether the internal column address YADD is an even number or an odd number. On the other hand, when a small $\overline{CAS}$ latency is set, one item of data sequentially supplied from the external is supplied from the data-in buffer to either the internal data buses IOBUS(E) or IOBUS(O), each one cycle of the internal clock ICLK. To which of IOBUS(E) and IOBUS(O) the data is outputted, is determined by whether the internal column address YADD is an even number or an odd number.

Figure 7:
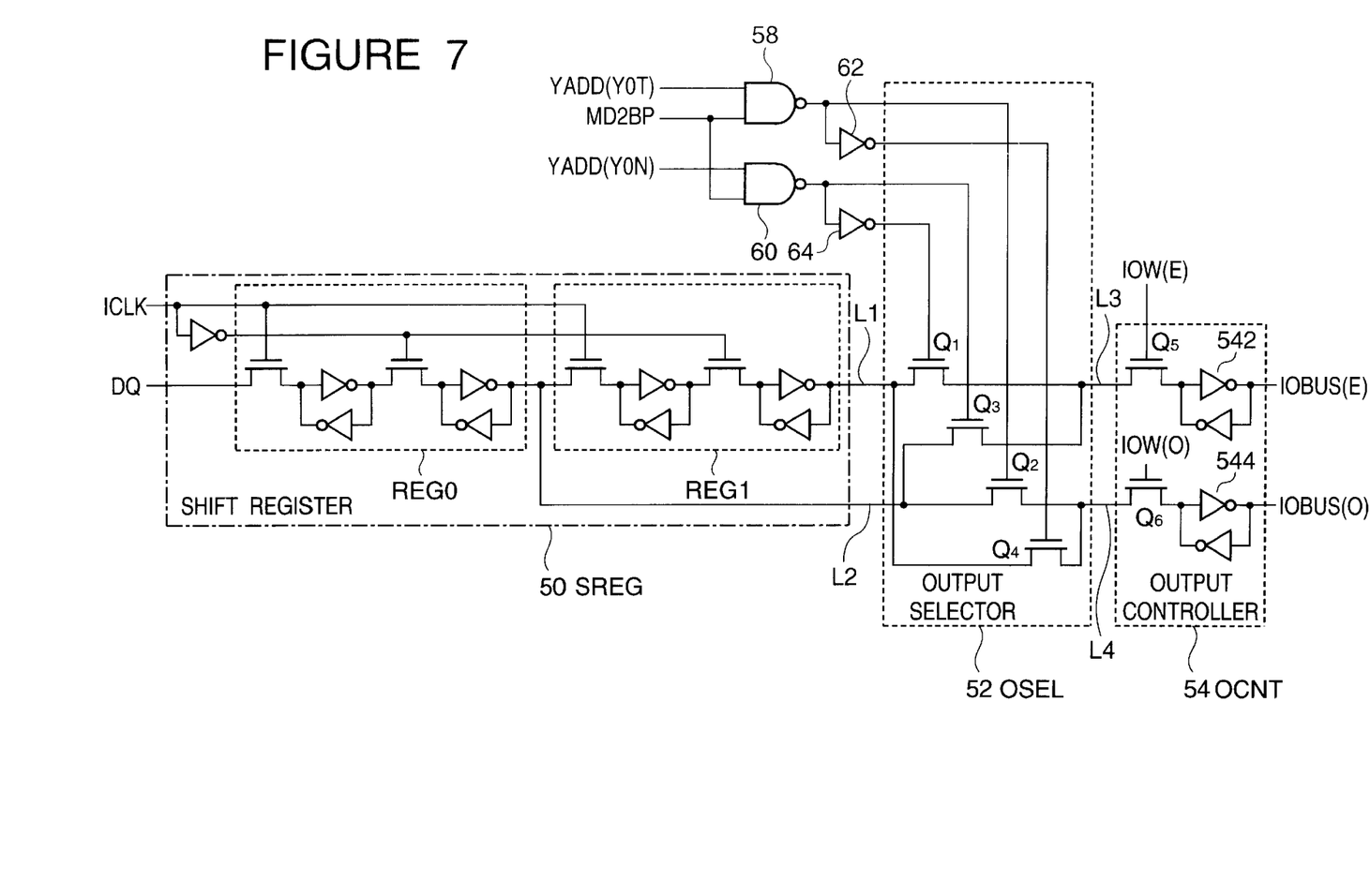
FIG. 7 is a circuit diagram of the data-in buffer incorporated in a second embodiment of the semiconductor memory in accordance with the present invention, having the burst mode transfer function.

Referring to FIG. 7, there is shown a circuit diagram of the data-in buffer incorporated in the second embodiment of the semiconductor memory in accordance with the present invention, for the purpose of illustrating the above mentioned differences in function. In FIG. 7, elements similar to those shown in FIG. 5 are given the same Reference Numerals and Signs, and explanation thereof will be omitted.

As seen from comparison between FIGS. 5 and 7, the data-in buffer of the second embodiment is composed of the shift register 50, the register output selector 52 and the selector output controller 54, similarly to the data-in buffer of the first embodiment. However, the control of the register output selector 52 and the selector output controller 54 is different from the data-in buffer of the first embodiment.

Specifically, the register output selector 52 is controlled by not only the least significant bit YADD(Y0T) of the internal column address signal YADD and the inverted signal YADD(Y0N) of the least significant bit YADD(Y0T), but also a prefetch enable signal MD2BP. For controlling the register output selector 52, the data-in buffer further includes a NAND gate 58 receiving the least significant bit YADD (Y0T) of the internal column address signal YADD and the prefetch enable signal MD2BP, and another NAND gate 60 receiving the inverted least significant bit YADD(Y0N) of the internal column address signal YADD and the prefetch enable signal MD2BP. An output of the NAND gate 58 is connected to the gate of the transfer gate transistor Q2, and through an inverter 62 to the gate of the transfer gate transistor Q4, and an output of the NAND gate 60 is connected to the gate of the transfer gate transistor Q3, and through an inverter 64 to the gate of the transfer gate transistor Q1.

With this arrangement, when the prefetch enable signal MD2BP is active, namely, at a logical high level, the register output selector 52 operates similarly to the first embodiment. On the other hand, when the prefetch enable signal MD2BP is inactive, namely, at a logical low level. The data held in the register REG0 is ceaselessly outputted towards both of the even-numbered column address internal data bus IOBUS (E) and the odd-numbered column address internal data bus IOBUS(O).

Furthermore, in the selector output controller 54, the transfer gate transistor Q5 is controlled by an even-numbered column address data output signal IOW(E), and the transfer gate transistor Q6 is controlled by an odd-numbered column address data output signal IOW(O).

Thus, one of the two operation modes is selected by the prefetch enable signal MD2BP. Namely, when the prefetch enable signal MD2BP is active to designate the prefetch operation, both of the address data output signals IOW(E) and IOW(O) are controlled similarly to the data-in buffer output signal IOW of the first embodiment. When the prefetch enable signal MD2BP is inactive to designate a non-prefetch operation, the address data output signals IOW (E) and IOW(O) are alternatively an alternately activated to cause the data to be supplied to only one of the even-numbered column address internal data bus IOBUS(E) and the odd-numbered column address internal data bus IOBUS (O) designated by the internal column address signal YADD.

Thus, if the prefetch enable signal MD2BP is interlocked with the setting of the $\overline{CAS}$ latency, when a large $\overline{CAS}$ latency is set, data is written, every two cycles of the internal clock ICLK, from the internal data buses IOBUS(E) and IOBUS(O) through the write amplifiers WAMP(E) and WAMP(O) and the sense amplifiers SA of the memory cell sub-arrays (MARR(E)) 30 and (MARR(O)) 32 into the selected memory cells. On the other hand, when a small $\overline{CAS}$ latency is set, data is written, each one cycle of the internal clock ICLK, from a selected one of the internal data buses IOBUS(E) and IOBUS(O), through one of the write amplifiers WAMP(E) and WAMP(O) connected to the selected internal data bus, and the sense amplifier SA of one of the memory cell sub-arrays (MARR(E)) 30 and (MARR (O)) 32 corresponding to the selected internal data bus, into the selected memory cell.

Figure 8:
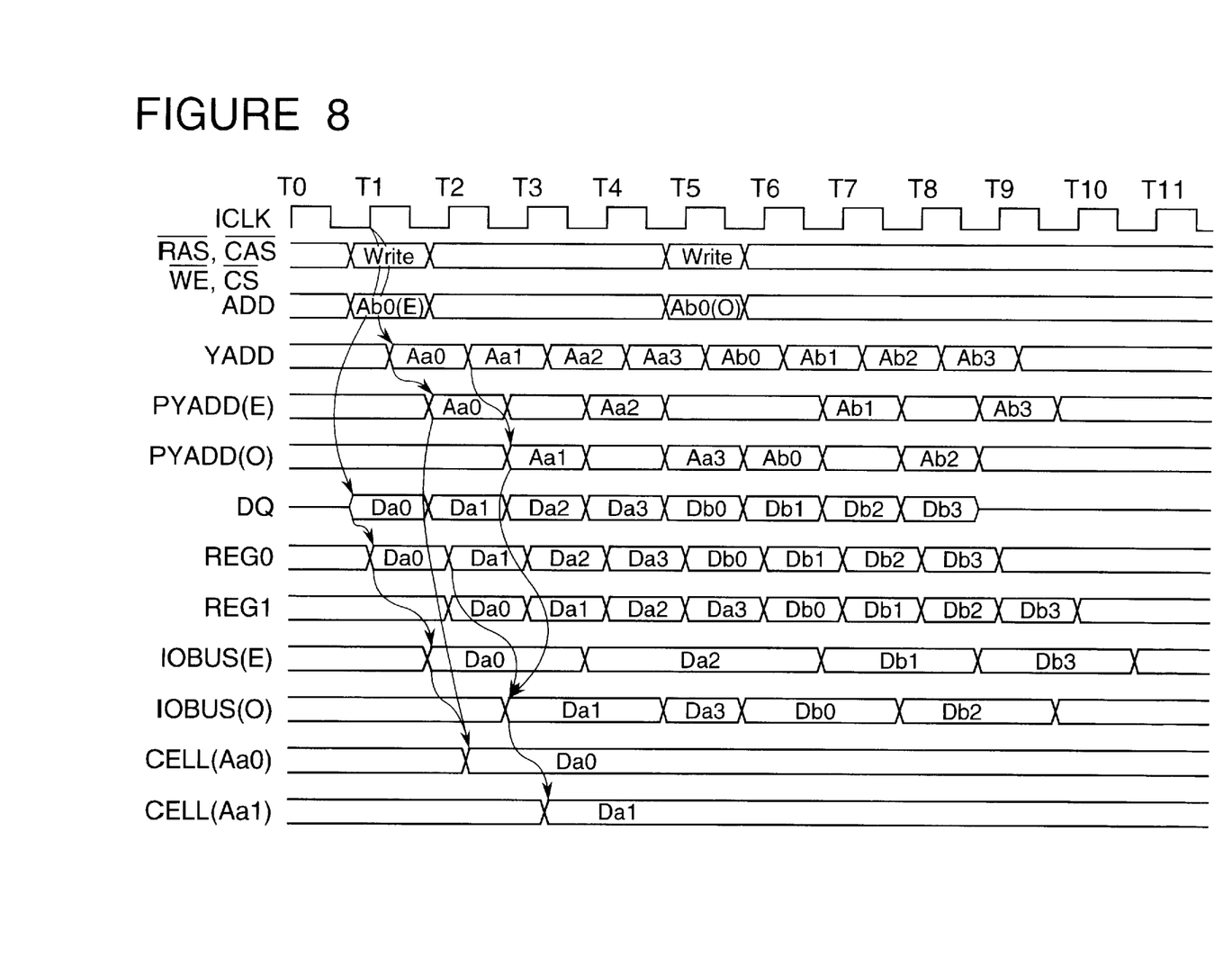
FIG. 8 is a timing chart illustrating an operation of the second embodiment of the semiconductor memory in accordance with the present invention.

Now, operation of the second embodiment of the semiconductor memory in accordance with the present invention will be described. However, the operation of the second embodiment when a large $\overline{CAS}$ latency is set, is the same as that of the first embodiment shown in FIG. 6. On the other hand, FIG. 8 is a timing chart illustrating an operation of the second embodiment when a small $\overline{CAS}$ latency is set. The other operation conditions are the same as those explained in connection with the first embodiment and with reference to FIG. 6. In the following, therefore, only the operation of the second embodiment when a small $\overline{CAS}$ latency is set, will be described.

In the example shown in FIG. 8, since at the input of the write command in the time T1 the column address "Aa0" for the head or first data of the burst is an even number, "Aa0" is outputted to the even-numbered column address bus PYADD(E) in synchronism with the edge of the internal clock ICLK of the cycle T1. Since the column address "Aa1" for the second data of the burst is an odd number, "Aa1" is outputted to the odd-numbered column address bus PYADD (O) in synchronism with the edge of the internal clock ICLK of the cycle T2. Furthermore, since at the input of the write command in the time T5 the column address "Ab0" for the head or first data of the burst is an odd number, "Ab0" is outputted to the odd-numbered column address bus PYADD (O) in synchronism with the edge of the internal clock ICLK of the cycle T5. Since the column address "Ab1" for the second data of the burst is an even number, "Ab1" is outputted to the even-numbered column address bus PYADD(E) in synchronism with the edge of the internal clock ICLK of the cycle T5.

In parallel to the above mentioned address processing, an external data is latched in the register REG0 of the data-in buffer in response to the edge of each internal clock ICLK, and supplied to either the even-numbered column address internal data bus IOBUS(E) or the odd-numbered column address internal data bus IOBUS(O) in accordance with the content of the internal column address YADD.

By means of the pre-decoded column address bus PYADD and the internal data bus IOBUS, data is written into a memory cell at the designated address through the write amplifier WAMP and the sense amplifier SA.

More specifically, since at the input of the write command in the time T1 the column address "Aa0" for the head or first data of the burst is the even number, data "Da0" is supplied from the data-in buffer to the even-numbered column address internal data bus IOBUS(E), and since the column address "Aa1" for the second data of the burst is the odd number, data "Da1" is supplied from the data-in buffer to the odd-numbered column address internal data bus IOBUS(O). Furthermore, since at the input of the write command in the time T5 the column address "Ab0" for the head or first data of the burst is the odd number, data "Db0" is supplied from the data-in buffer to the odd-numbered column address internal data bus IOBUS(O), and since the column address "Ab1" for the second data of the burst is the even number, data "Db1" is supplied from the data-in buffer to the even-numbered column address internal data bus IOBUS (E).

As seen from the above, when a large $\overline{CAS}$ latency is set, two bits of data are written simultaneously in parallel into the memory cell array of the DRAM core, every two clocks of the reference clock, and through the even-numbered and odd-numbered column address internal data buses, respectively. On the other hand, when a small $\overline{CAS}$ latency is set, data is written, bit by bit, into the memory cell array of the DRAM core, each one clock of the reference clock, and through either the even-numbered or odd-numbered column address internal data bus.

Thus, when a large $\overline{CAS}$ latency is set, the pipelined architecture and the prefetching architecture are used in combination and simultaneously, so that a high burst transfer frequency is realized. When a small $\overline{CAS}$ latency is set, the semiconductor memory operates only in the pipelined architecture without performing the prefetch operation, so that the data inputting/outputting can be executed every one reference clock, not in units corresponding to the degree of parallelism. Accordingly, the writing operation can be speeded up.

As mentioned above, since the semiconductor memory in accordance with the present invention having the burst mode transfer function is characterized in that the data writing is conducted on the basis of only the edge of the internal clock which is used for latching the data supplied later in sequence, of each two data bits to be written simultaneously in parallel to the internal data buses, the data writing is in no way limited by other factors, for example, the column address signal supplied from the external. Accordingly, even if the address access time in the reading operation is constant, when a high frequency reference clock is used and a large $\overline{CAS}$ latency is set, it is possible to elevate the burst transfer frequency by using the pipelined architecture and the prefetching architecture in combination and simultaneously. Therefore, the writing operation can be speeded up.

On the other hand, when a small $\overline{CAS}$ latency is set, if the semiconductor memory operates only in the pipelined architecture without performing the prefetch operation, the data inputting/outputting can be executed every one reference clock, not in units corresponding to the degree of parallelism. Accordingly, the writing operation can be speeded up.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory having a burst mode transfer function, comprising:
    a plurality of memory cell sub-arrays which are accessible in parallel and simultaneously;
    a plurality of internal data buses for inputting and outputting data to and from said plurality of memory cell sub-arrays, in parallel; and
    an input buffer circuit receiving an external data signals continuously and sequentially in time in synchronism with a reference clock signal, for converting said receiving serial data into a parallel data under control of an external command signal and an external address signal, so as to distribute said parallel data to said plurality of internal data buses, the input buffer circuit including a shift register circuit composed of a plurality of cascade-connected registers and for latching and shifting said external data signals only in response to said reference clock signal, said cascade-connected registers outputting, in parallel, said data latched in said respective registers, and a register output selecting means receiving said data signals outputted in parallel from said cascade-connected registers, for distributing said received parallel data signals, in parallel, to said plurality of internal data buses in accordance with said external address signal.

2. A semiconductor memory claimed in claim 1 wherein said input buffer circuit further includes a buffer output control means for transferring said outputs of said register output selecting means, simultaneously and in parallel, to said plurality of internal data buses, in synchronism with an edge of said reference clock signal by which said external data signal finally supplied to said shift register circuit is latched in said shift register circuit.

3. A semiconductor memory claimed in claim 1 further including a function selecting means for designating the function of said input buffer circuit, so that said input buffer circuit is controlled by an output of said function selecting means to alternatively assume a first mode of distributing said parallel data signals outputted from said shift register circuit, in parallel, to said plurality of internal data buses in accordance with said external address signal, or a second mode of outputting only said external data signal finally supplied and latched in said shift register circuit, to one of said plurality of internal data buses in accordance with said external address signal.

4. A semiconductor memory claimed in claim 3 wherein said output of said function selecting means is set in interlocking with said setting of the number of reference clock cycles required from the inputting of the reading external command to the outputting of read-out data.

* * * * *